United States Patent [19]
Kim

[11] Patent Number: 5,574,733
[45] Date of Patent: Nov. 12, 1996

[54] SCAN-BASED BUILT-IN SELF TEST (BIST) WITH AUTOMATIC RESEEDING OF PATTERN GENERATOR

[75] Inventor: Kee S. Kim, Folsom, Calif.

[73] Assignee: Intel Corporation, Santa Clara, Calif.

[21] Appl. No.: 506,661

[22] Filed: Jul. 25, 1995

[51] Int. Cl.$^6$ .................................................. G01R 31/28
[52] U.S. Cl. ........................ 371/27; 371/22.3; 371/22.4; 371/22.5; 371/22.6
[58] Field of Search ........................ 371/27, 22.3, 22.4, 371/22.5, 22.6; 377/72, 64

[56] References Cited

U.S. PATENT DOCUMENTS

| | | | |
|---|---|---|---|
| 4,389,723 | 6/1983 | Nigorikawa et al. ...................... | 371/27 |
| 4,959,832 | 9/1990 | Bardell, Jr. ................................ | 371/27 |
| 5,090,035 | 2/1992 | Murase ...................................... | 377/72 |
| 5,101,409 | 3/1992 | Hack ......................................... | 371/21.3 |
| 5,301,199 | 4/1994 | Ikenaga et al. .......................... | 371/22.5 |
| 5,369,648 | 11/1994 | Nelson ..................................... | 371/27 |
| 5,383,143 | 1/1995 | Crouch et al. ........................... | 364/717 |

OTHER PUBLICATIONS

Krasniewski, et al.; *Circular Self–Test Path: A low–Cost BIST Technique*; ACM/IEEE Design, Automation Conference Proceedings, 1987.

Pomeranz, et al.; *A Learning–Based Method to Match a Test Pattern Generator to a Circuit–Under–Test*; International Test Conference Proceedings, IEEE Computer Society, 1993.

Nadeau–Dostie, et al.; *ScanBist A Multi–frequency Scan–Based BIST Method*; International Test Conference Proceedings; IEEE Computer Society, 1992.

*Primary Examiner*—Hoa T. Nguyen
*Attorney, Agent, or Firm*—Blakely, Sokoloff, Taylor & Zafman

[57] ABSTRACT

A scan chain and method of generating non-successive pseudo-random test patterns for performing a built-in self test (BIST) on a circuit block in an integrated circuit. The scan chain includes a linear feedback shift register (LFSR) cascaded with a shift register. An output of a last storage element of the shift register is fed back in to an input of a first storage element of the LFSR such that the shift register and LFSR form a circular path. A first test pattern is generated in the scan chain when a data string stored in the shift register is shifted through the LFSR. The test pattern is then asserted on inputs of the circuit block. The circuit response is stored in the scan chain, and the scan chain is shifted once more in order to compress the result and generate a second test pattern simultaneously.

19 Claims, 4 Drawing Sheets

SCAN-BASED BUILT-IN SELF TEST (BIST) WITH AUTOMATIC RESEEDING OF PATTERN GENERATOR

FIELD OF THE INVENTION

The present invention relates to the field of integrated circuit testing. In particular, the field relates to a scan chain and method of generating non-successive pseudo-random test patterns for performing a built-in self test on a circuit block in an integrated circuit.

BACKGROUND OF THE INVENTION

Prior microprocessors often employ circuitry for performing a built-in self test ("BIST") of internal circuit blocks. During a BIST sequence, a plurality of test patterns are delivered to internal circuit blocks and the responses of the circuit blocks are then observed. Thus test pattern generation and response observation are two primary functions performed by BIST circuitry.

The internal circuitry of a microprocessor is often separated into combinational blocks and sequential blocks, the sequential blocks comprising clocked circuitry such as flip-flops. One prior circuit used for testing combinational and sequential circuit blocks in a microprocessor is a "scan chain." A scan chain includes a plurality of storage elements that are cascaded such that the output of a first storage element is coupled to the input of the next stage storage element. Scan chains thus allow a user of the microprocessor to test circuit blocks by serially scanning in test patterns to the storage elements. The test patterns are then applied to the circuit block, and circuit test results are serially scanned out. The use of these scan chains can be costly because test patterns must be stored and applied by an external tester. Moreover, scan chains are slow because the circuit responses must be scanned out and compared by the tester subsequent to the application of each test pattern.

One advantage of incorporating BIST capability in to a microprocessor is that required test patterns are self-generated by the BIST circuitry. The test patterns may either be generated prior to the BIST sequence and stored in internal memory, or the test pattern generation may occur as the BIST sequence is being performed. The latter method is advantageous in that it eliminates a need for potentially large storage areas in which test patterns must be held.

The BIST circuitry is not only used for test pattern generation, but is also used for circuit response observation. One response observation method involves comparing the result of each circuit response with its corresponding expected pattern. This method is burdensome, especially for complex circuit blocks with large numbers of outputs, because the large volumes of patterns must be compared. Another method of response observation is called response compression, wherein the output of the response is passed through a compactor that will generate a compressed output, called a signature. The signature, being of smaller size than the circuit output response, can then be compared with its corresponding expected signature value.

FIG. 1 illustrates a block diagram of a prior art BIST circuit including a circular path 170. The circular path 170 is capable of acting as a cyclic shift register, wherein the output of each flip-flop is shifted in to the input of the next stage, with the output of the last flip-flop 113 being fed back to the input of flip-flop 110. The FIG. 1 embodiment is often referred to as Circular BIST ("CBIST").

The CBIST circuit of FIG. 1 is capable of performing both pattern generation and signature generation simultaneously. The multiplexers 120a–d are used to select the input to the flip-flops 110–113. The input selected can either be the output of the circuit block 100, or the shift input, which is the output of the previous stage XOR gate. When the shift input is selected, the XOR gates 130a–d facilitate pattern generation and signature compression within the circular path 170. The operation of the CBIST circuit shown in FIG. 1 is discussed in: Krasniewski and Pilarski, *Circular Self-Test Path: A Low-Cost BIST Technique*, ACM/IEEE Design Automation Conference Proceedings, 1987.

Although the CBIST scheme of FIG. 1 allows for simultaneous pattern generation and compression, one problem with CBIST is that the test patterns generated are dependent upon the circuit block 100. This limits fault coverage of the circuit block 100 by limiting the richness of the test patterns generated. The CBIST implementation of FIG. 1 also has a large circuit delay and area penalty due to the need for one XOR gate and multiplexer per flip-flop.

FIG. 2 illustrates another prior BIST circuit known as a primitive polynomial linear feedback shift register (LFSR). The LFSR of FIG. 2 can be used for both test pattern generation and signature generation. The LFSR comprises a chain of scan flip-flops 210–213, each scan flip-flop having the functionality of a flip-flop and a 2-input multiplexer. This allows each flip-flop to receive one of two inputs, a shift input from the previous stage flip-flop or the outputs 230a–d from a circuit block (not shown).

The LFSR is first initialized with a data string, known as the test seed. The LFSR is then shifted, wherein the feedback path 250 and XOR gate 240 of the LFSR create a new data pattern in the flip-flops 210–213. The new data pattern is predictable; the LFSR will generate a pattern in accordance with a characteristic polynomial. The LFSR of FIG. 2 is constructed such that the characteristic polynomial is a "primitive polynomial." Primitive polynomial LFSRs will generate a maximum-length test sequence, thus increasing the fault coverage for a circuit block above that for a non-primitive LFSR. The BIST patterns generated by an LFSR are therefore less dependent on the circuit block than the CBIST scheme shown in FIG. 1. Because the output test patterns of an LFSR appear to be almost random, the test patterns are termed "pseudo-random" sequences.

A problem with LFSRs, however, is that its XOR feedback paths take up a lot of circuit area within the microprocessor. This is especially a problem for LFSRs comprised of many flip-flops, used for testing circuit blocks with large numbers of inputs and outputs. Another problem associated with LFSRs is that it takes a long time for LFSRs to sequence through all of the test patterns. Moreover, LFSRs can only be used to test combinational logic circuits, limiting their applicability for testing the internal circuitry of a microprocessor.

One prior art technique of minimizing test times while still providing good circuit fault coverage involves "reseeding" of an LFSR. Reseeding occurs when the LFSR is interrupted and provided with a new test seed before the completion of a test sequence. This technique is believed to provide high fault coverage of the circuit block while reducing the time required for test sequences to complete. An explanation of this reseeding hypothesis is located in: Pomeranz and Reddy, *A Learning-Based Method to Match a Test Pattern Generator to a Circuit-Under-Test*, International Test Conference Proceedings (IEEE Computer Society, 1993). A problem with one implementation of this reseeding scheme is that it involves a large amount of circuit area. Memory is required to store the potentially large number of test seeds, and additional circuitry is needed to retrieve each new test seed from memory and load the seed into the LFSR.

Both the CBIST circuit of FIG. 1 and the LFSR circuit of FIG. 2 require a significant amount of circuit area and produce a significant time delay during testing. The LFSR reseeding technique improves testing times, but requires a large amount of circuit area for test seed storage. It is therefore desirable to incorporate a BIST circuit within a microprocessor that decreases circuit area and delay times while maximizing circuit fault coverage.

SUMMARY OF THE INVENTION

A scan chain and method of generating non-successive pseudo-random test patterns for use in a built-in self test (BIST) of a circuit block in an integrated circuit is described. The scan chain includes a linear feedback shift register (LFSR) cascaded with a shift register. An output of a last storage element of the shift register is fed back to an input of a first storage element of the LFSR such that the shift register and LFSR form a circular path.

A first test pattern is generated, according to a characteristic polynomial of the LFSR, when a data string stored in the shift register is shifted through the LFSR. The test vector is then applied to inputs of the circuit block. The resulting outputs of the circuit block are stored back in the scan chain. Subsequently, the scan chain is again shifted such that the data string stored in the shift register is shifted through the LFSR and compressed according to the characteristic polynomial of the LFSR, thus generating a second, non-successive, test pattern.

Other features and advantages of the present invention will be apparent from the accompanying drawings and the detailed description that follows.

BRIEF DESCRIPTION OF THE DRAWINGS

The present invention is illustrated by way of example and not limitation in the figures of the accompanying drawings in which like references indicate similar elements and in which.

DETAILED DESCRIPTION

A scan chain and method of performing a built-in self test (BIST) on a circuit block in a microprocessor is described. The scan chain includes a linear feedback shift register (LFSR) cascaded with a shift register, wherein the LFSR and shift register are further coupled to form a circular path. The scan chain is used to simultaneously generate test patterns and compress test results during a built-in self test (BIST) sequence.

The embodiment of the scan chain described below is implemented in a microprocessor. The scan chain and method are used to perform tests on internal circuit blocks in the microprocessor. Alternatively, the scan chain and method are implemented in an integrated circuit including one or more internal circuit blocks to be tested.

The scan chain and method of performing a built-in self test of a circuit block will be described in more detail herein below.

Figure 1:
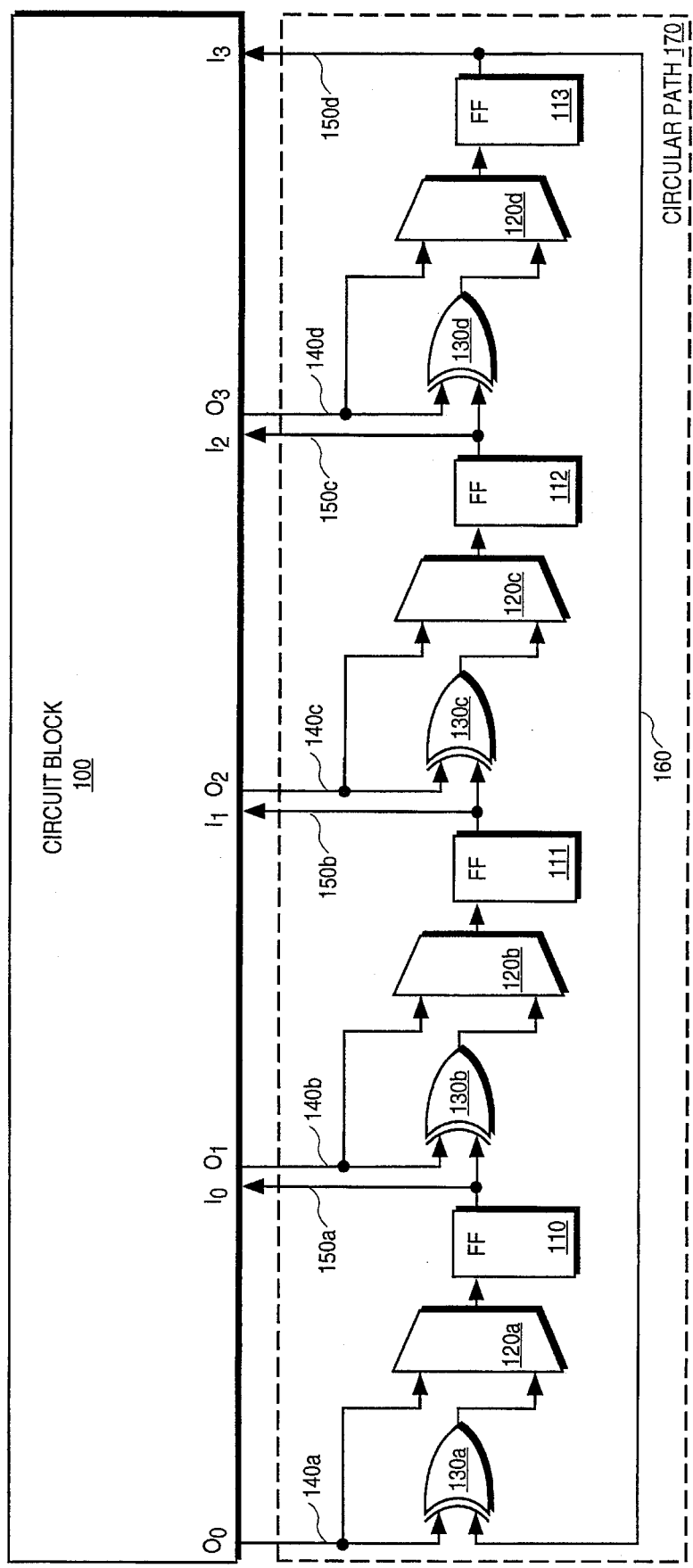
FIG. 1 is a block diagram of a prior art circular built-in self test (CBIST)circuit.
Figure 2:
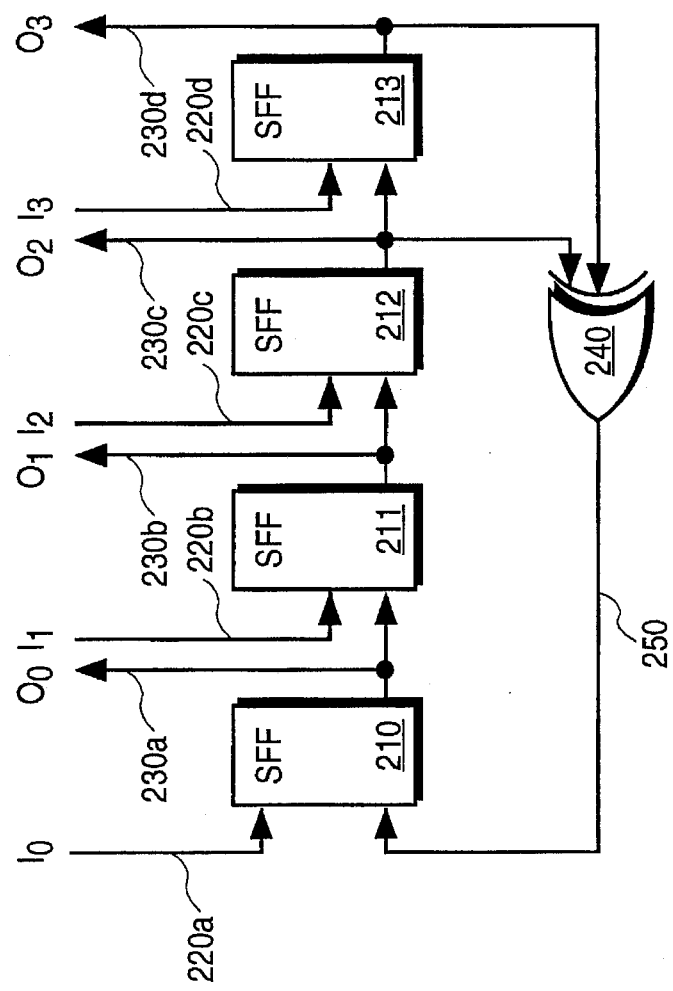
FIG. 2 is a block diagram of a prior art primitive polynomial linear feedback shift register (LFSR).
Figure 3:
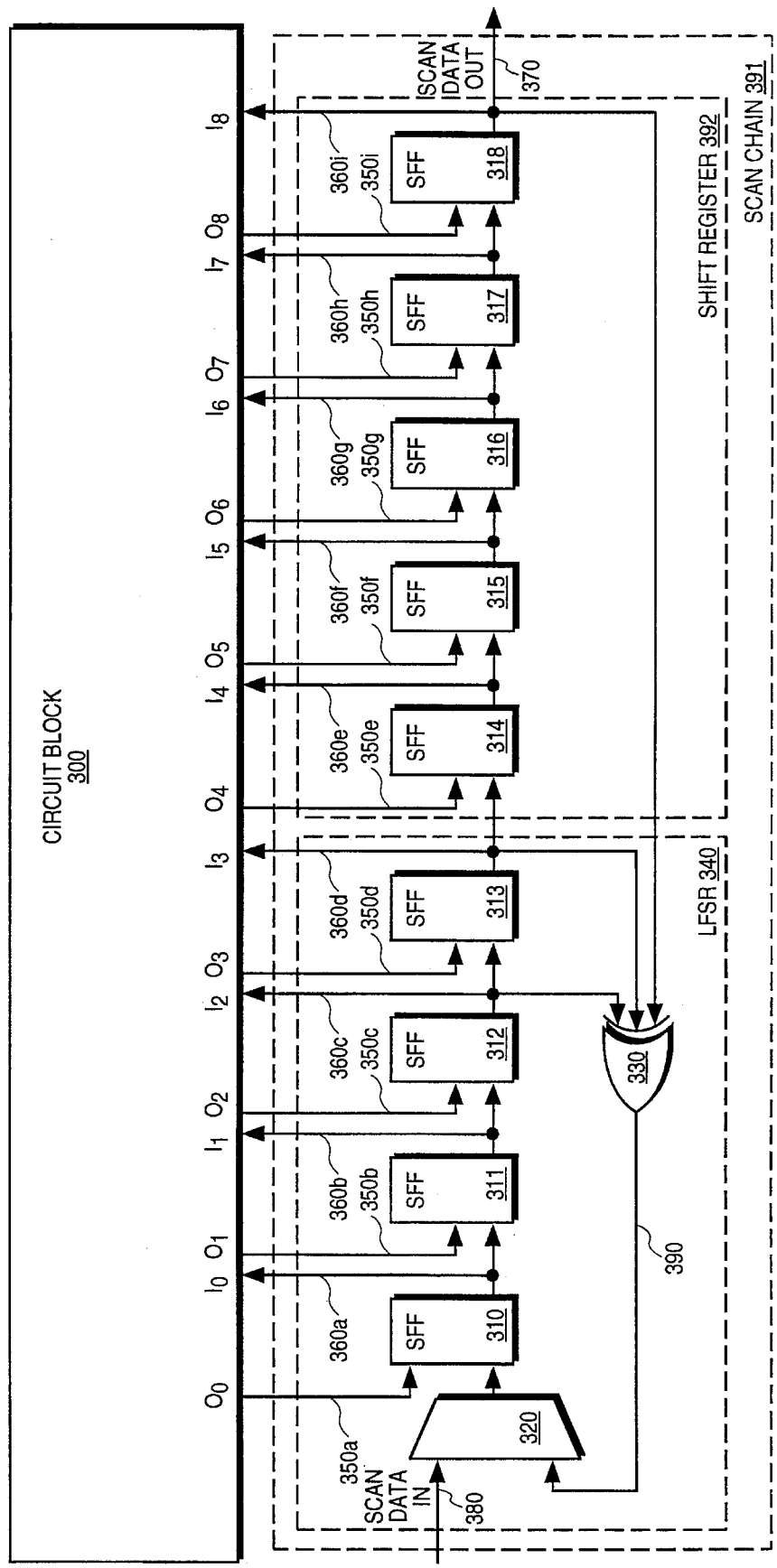
FIG. 3 includes a block diagram of a scan chain in accordance with one embodiment of the present invention.

FIG. 3 illustrates a block diagram of a scan chain 391 used to test a circuit block 300. For one embodiment, the circuit block 300 comprises combinational logic elements. For another embodiment, the circuit block 300 comprises sequential logic elements.

Scan chain 391 is used to perform two functions on the circuit block 300. The scan chain 391 generates test patterns to be applied to the inputs 360$a$–$i$ of the circuit block 300, and creates a signature with the outputs 350$a$–$i$ of the circuit block 300. For one embodiment, test pattern generation and signature generation occur simultaneously, thus minimizing the amount of time required for the BIST sequence to complete.

The particular embodiment of the scan chain 391 shown in FIG. 3 includes 9 flip-flops 310–318. Flip flops 310–313 comprise LFSR 340, and flip-flops 314–318 comprise shift register 392. For one embodiment, each of the flip-flops 310–318 is a scan flip-flop (SFF) capable of being loaded and shifted upon receipt of a clock signal, and capable of being reset to an initial value by a common reset signal. Each scan flip-flop incorporates a multiplex function such that the flip-flop may accept two different inputs, depending on the state of a control signal (not shown). If the control signal is in a first state, then each flip-flop selects its input from the output of the previous stage flip-flop. For instance, flip-flop 318 selects the output from flip-flop 317. If the control signal is in a second state, then each flip-flop selects its input from the circuit block 300. Flip flop 318 would thus select O8 350i as its input. Alternative embodiments of the flip-flops 310–318 include various well-known implementations of storage elements capable of receiving input from more than one source. For one embodiment of the scan chain 391, the flip-flops 310–318 comprise sequential logic elements that are already present within the microprocessor. The addition of scan chain 391 to the microprocessor circuitry therefore adds minimal circuit area to the existing design.

The circuit block 300 is coupled to the scan chain 391 such that data from inputs 10–18 and outputs O0–O8 can be loaded in to and out of the scan chain 391 in parallel. The inputs of the circuit block 300, labeled 360$a$–$i$, are coupled to the outputs of the flip-flops 310–318. This enables the circuit block 300 to receive data from the scan chain 391 during a BIST sequence. The outputs to the circuit block 300, labeled 350$a$–$i$, are coupled to the inputs of the scan chain 391 so the scan chain can receive data from the circuit block 300.

The embodiment of FIG. 3 includes the same number of flip-flops 310–318 as there are inputs 10–18 and outputs O0–O8 of the circuit block 300. For an alternative embodiment, the scan chain 391 comprises a different number of flip-flops than there are inputs and outputs to the circuit block 300. For an embodiment in which the circuit block 300 has more inputs and outputs than flip-flops, the extra inputs need to be provided with known test values and the extra outputs need to be included in the signature generation. One embodiment of scan chain 391 therefore includes extra flip-flops that are used to provide known test values to the extra inputs of circuit block 300. The extra outputs of circuit block 300 are fed into a "parity tree," wherein a tree of XOR gates accepts the extra outputs and feeds in to the XOR gate 330.

For another embodiment in which the scan chain 391 includes less flip-flops than inputs or outputs, more than one scan chain is employed to test the circuit block 300.

There are two modes in which the scan chain 391 operates. The first is system mode. In system mode, the scan chain 391 operates as a parallel load register with each assertion of a clock. Therefore in system mode each scan flip-flop 310–318 receives its input from the outputs 350$a$–$i$ of the circuit block 300. System mode also enables the outputs of scan flip-flops 310–318 to be asserted on the inputs 360$a$–$i$ of the circuit block 300.

The second mode that scan chain 391 operates in is test mode. During test mode, the flip-flops 310–318 are loaded serially upon receipt of a clock signal. Thus each flip-flop 310–318 receives as its input the output of the previous stage flip-flop.

In test mode, the multiplexer 320 selects between two inputs for flip-flop 310 during test mode. The first input is the scan data in 380, which is used to initialize the flip-flops 310–318 with a nonzero value. For one embodiment, the scan data in 380 input allows a user of the microprocessor to initialize the scan chain 391 for purposes of testing and debugging. For an alternative embodiment, the microprocessor contains several scan chains, such that scan chain 391 is cascaded with other scan chains. The scan data in 380 or scan data out 370 would therefore be coupled to another scan chain such that the contents of all scan chains would be shifted upon assertion of a common clock signal.

Because the scan chain 391 comprises a circular scan path, alternative embodiments include configurations wherein the LFSR 340 is cascaded to one or more shift registers in any order. Thus the LFSR 340 need not be the first element located in the scan chain 391.

Other embodiments of scan chain 391 include circuit elements inserted between the cascaded LFSR 340 and shift register 392. One such embodiment includes an inverter inserted between the output of the LFSR 340 and the shift register 392. Thus a logical one is provided to the input of the shift register 392 whenever the last flip-flop 313 of the LFSR 340 contains a logical zero. This is beneficial because when reset to all-zeros, the LFSR 340 will continue to generate an all-zero test pattern unless the LFSR 340 receives a logical one at its input.

The other input to the scan chain 391 is from feedback path 390. Feedback path 390 is the output of XOR gate 330, which includes as inputs the LFSR feedback from flip-flops 312 and 313, and also includes the output of the last flip-flop 318 of the scan chain 391. Thus the feedback path from the output of flip-flop 318 couples the LFSR 340 and shift register 392 in a circular path. When the scan chain is operating in test mode, and the multiplexer 320 selects feedback path 390, the contents of the shift register 392 are shifted through the LFSR 340.

This arrangement shown in FIG. 3, in which the LFSR 340 is coupled in a circular path with the shift register 392, ensures good fault coverage while minimizing circuit area and testing times. As was mentioned previously, one problem with using LFSRs to test a circuit block is that the test time can become lengthy when the number of inputs and outputs to the circuit block is large. An LFSR generates a fixed set of successive pseudo-random patterns that are tested one after the other. A primitive polynomial LFSR comprising N flip-flops will produce a test sequence comprising ($2^{N-1}$) test patterns. For example, given the 9-input circuit block 300 of FIG. 3, a primitive-polynomial based test sequence would comprise 511 successive test patterns. While this number is not unmanageable, sequence lengths and test times become very large for circuit blocks including large numbers of inputs and outputs, such as those found in microprocessors. A circuit block including 32 inputs would have a test sequence comprising over 4 billion test patterns.

The embodiment of the scan chain 391 illustrated in FIG. 3 incorporates an automatic reseeding scheme. Reseeding disturbs the regular progress of the LFSR sequence such that the test pattern generated with the new seed is non-successive, i.e. the new pattern is not the next pattern in the LFSRs regular sequence. The output of flip-flop 318 is fed back in to the XOR gate 330 of the LFSR 340. Thus when the scan chain 391 is in the test mode, and multiplexer 320 has the feedback loop 390 selected as an input to the LFSR 340, the LFSR 340 receives its input from the XOR gate 330. The XOR gate 330 receives as an input the last bit of the shift register 392. This feedback from the last flip-flop 318 has the effect of disturbing the successive pattern generation of the LFSR 340, making the LFSR 340 jump to a non-successive test pattern. The reseeding operation therefore occurs automatically whenever the contents of the scan chain 391 is shifted with feedback loop 390 selected as an input to flip-flop 310.

In an alternative embodiment of the invention, the XOR gate 330 has only two inputs from flip-flops 312 and 313, and does not have an input from the last flip-flop 318. This embodiment does not include automatic reseeding of the LFSR 340.

The scan chain 391 is used to perform both test pattern generation and signature creation simultaneously, as will be explained in further detail herein below.

A method of performing a built-in self test on a circuit block using a reseeding scan chain is shown in FIG. 4$a$. The flow diagram of FIG. 4$a$ will be explained with reference to the circuitry of FIG. 3.

The original test seed is first scanned in to the scan chain 391 using test mode. Step 410 is accomplished by asserting one bit of the seed at a time on the scan data in line 380 while applying appropriate clock pulses to the flip-flops 310–318. Scan chain 391 requires a seed nine bits long in order to initialize all flip-flops 310–318. During step 410, multiplexer 320 selects scan data in 380 rather than feedback path 390 as the input to flip-flop 310. The LFSR 340 will therefore not generate feedback to flip-flop 310 via XOR gate 330 while the test seed is being scanned in.

At step 411 the system mode is entered, wherein the scan chain 391 is configured for a parallel load rather than the serial load used in step 410. The system mode is a mode in which the scan chain 391 operates as a conventional register, wherein the inputs to flip-flops 310–318 come from lines 350$a$–$i$ and the outputs of flip-flops 310–318 are asserted on lines 360$a$–$i$.

Once the scan chain 391 has entered the system mode, the outputs of flip-flops 310–318 are asserted on the inputs of the circuit block 300 on lines 360$a$–$i$. This is shown as step 412.

The circuit block 300 thereafter generates a response to the inputs asserted during step 412. The scan chain 391 remains in the system mode at step 413 so that it can receive a parallel data load. Once the response has been generated by the circuit block 300, the response is asserted on output lines 350$a$–$i$ and is stored back in the flip-flops 310–318 of the scan chain 391.

The LFSR 340 is then used to create a signature from the test results at step 414. The signature is created by putting the scan chain 391 in scan mode, such that each flip-flop selects the output of the previous stage flip-flop as its input. This is similar to the mode used for the scan in step 410, however, during step 414 the new test seed is not being scanned in on line 318. Rather, the multiplexer 320 selects the feedback path 390 as the input to flip-flop 310. When the flip-flops 310–318 are clocked, the contents of the scan chain 391 will be shifted. The contents of flip-flops 314–318 comprising the shift register 391, will be fed back over feedback path 390, shifting the contents of the shift register through the LFSR 340. The LFSR 340 compresses the contents of the shift register 392 in to a signature. For one embodiment, step 414 includes the step of applying at least enough clock pulses to shift the bits of the shift register through the LFSR 340. For the scan chain 391, the scan chain 391 would be shifted at least five times because shift register 392 comprises five flip-flops 314–418. The signature is then contained within the flip-flops 310–313 of the LFSR 340.

The LFSR 340 not only forms a signature from the test results during step 414, but also generates a new non-successive test pattern. As the contents of the shift register 392 are being shifted through the LFSR 340, the LFSR 340 is generating a new pseudo-random test pattern while being automatically reseeded by the feedback path 390. Thus once step 414 has completed, a new non-successive test pattern resides within the scan chain 391.

At step 415, a decision is made as to whether or not the built-in self test sequence has completed. The number of sequences that are run during the built-in self test is typically predetermined and designated in code or circuitry internal to the microprocessor. For one embodiment, the performance of BIST sequences is controlled by a control unit within the microprocessor (not shown). An embodiment of the control unit uses microcode instructions to control the operation of the scan chain 391 and to analyze test results of the built-in self test.

At step 415, if the built-in self test sequence is completed, then the signature within the LFSR 340 and/or the shift register 392 is analyzed. One way this is accomplished is by comparing the signature with the intended results. For this embodiment, the analysis is performed by the control unit and the intended results are stored internally to the microprocessor. Once the signature has been compared with its intended value, the control unit indicates whether or not the BIST passed or failed. Another way of analyzing the signature is to write the final signature to a register within the microprocessor, such that system software using the microprocessor can read the signature in the register to determine whether the BIST passed or failed. Yet another analysis is performed by serially scanning out the contents of the scan chain 391 on scan data out line 370 and comparing the signature with its intended value.

If at step 415 the built-in self test sequence is determined to not be completed, then the pseudo-random test pattern contained in the scan register 391 is reapplied to the inputs 360a–i of the circuit block 300. The operations of steps 411–414 are then repeated until the BIST sequence is complete.

Figure 4A:
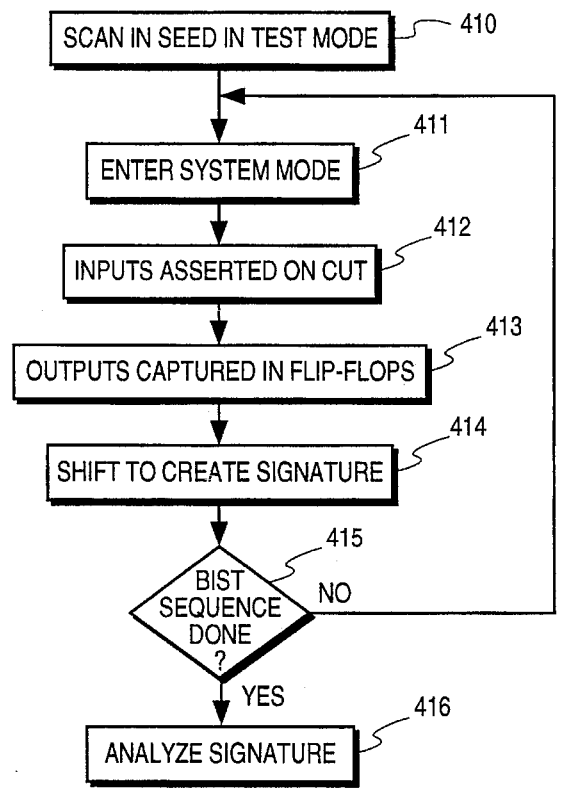
FIGS. 4A and 4B are flow diagrams illustrating two methods by which a combinational logic block may be tested according to an embodiment of the present invention.
Figure 4B:
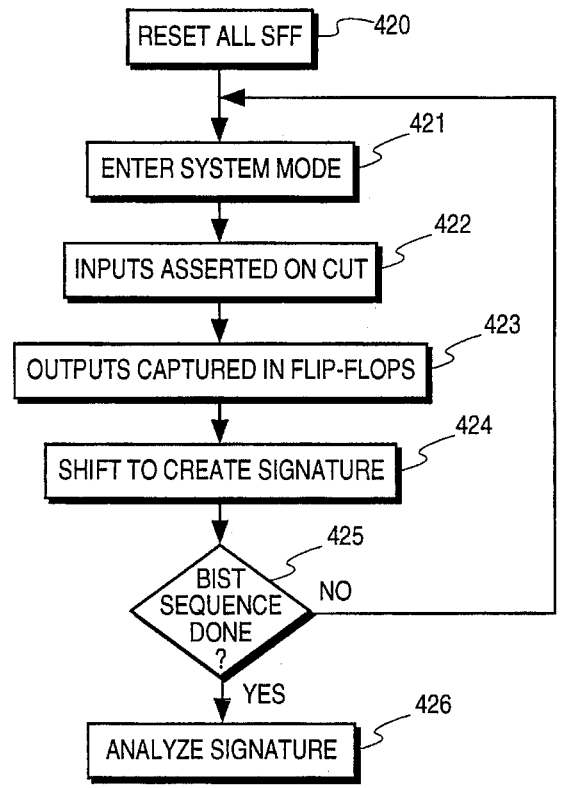

The method of FIG. 4b may also be used to perform a built-in self test using the reseeding scan chain 391. The method of FIG. 4b does not require that the initial test seed be scanned in to the scan chain 391 as in step 410. Rather, at step 420 the flip-flops 310–318 are reset to their initial value by a global reset signal. For one embodiment this initial value is the zero state. The initial value is then applied to the circuit block 300 inputs 360a–i in system mode, as shown for steps 421 and 422. The scan chain 391 captures the circuit response on lines 350a–i at step 423, and shifts its contents at step 424 to simultaneously create a signature and generate a new pseudo-random test pattern.

The decision is made at step 426 as to whether the built-in self test sequence is completed. If so, the signature is analyzed. Otherwise the contents of the scan chain are once again asserted on the circuit block 300 inputs 360a–i.

The method of FIG. 4b is similar to that shown in FIG. 4a. One difference is that the method of FIG. 4b does not include a step of scanning in an initial test seed as is shown in step 410. While it may seem undesirable to eliminate the test seed initialization capability, the method of FIG. 4b has the advantage in that an embodiment of its circuit implementation takes up less space than that of FIG. 4a. This is because step 410 in FIG. 4a requires an extra multiplexer, such as multiplexer 320 of FIG. 3, to incorporate the scan in function.

For an alternative embodiment of the invention, the scan chain of the present invention is used only for test pattern generation and not signature compression. Thus a separate signature analyzer is employed for receiving the output of the circuit block 300. Another embodiment uses two scan chains similar to scan chain 391, one scan chain for generating test patterns and another for capturing the test results and generating signatures.

Thus, in the foregoing detailed description a scan chain and method of performing a built-in self test on a circuit block in a microprocessor has been described. The scan chain comprises an LFSR cascaded with a shift register. The output of the shift register is fed back to the input of the LFSR such that the contents of the shift register can be shifted through the LFSR. This has the effect of creating a non-successive pseudo-random test pattern within the scan chain. The scan chain alternatively includes more than one LFSR cascaded with one or more shift registers.

The method described generates non-successive pseudo-random test patterns for testing a circuit block while simultaneously generating a signature from circuit test results.

In the foregoing specification, the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than a restrictive sense.

I claim:

1. A method of generating non-successive pseudo-random test patterns for testing a circuit block in an integrated circuit, the method comprising the steps of:

a) generating a first test pattern in a scan chain that includes a linear feedback shift register (LFSR) being cascaded with a shift register, the scan chain further includes a feedback path which is formed by connecting the output of the shift register to the input of the LFSR, said generating step is performed by shifting first contents of the shift register of the scan through the LFSR by means of the feedback path of the scan chain;

b) asserting the generated first test pattern at inputs of the circuit block;

c) storing outputs from the circuit block in the scan chain; and d) generating a second, non-successive, test pattern in the scan chain by shifting second contents of the shift register through the LFSR by means of said feedback path, wherein the LFSR generates the second test pattern according to a characteristic polynomial.

2. A method of performing a built-in self test (BIST) on a circuit block of an integrated circuit, the method comprising the steps of:
   a) setting contents of a scan chain to an initial value, wherein the scan chain includes a linear feedback shift register (LFSR) cascaded with a shift register, and wherein an output of a last storage element in the scan chain is fed back to an input of a first storage element of the LFSR such that contents of the shift register are shifted through the LFSR upon application of a test clock;
   b) generating a test pattern in the scan chain by applying the test clock N times, such that a data string of length N stored in the shift register is shifted through the LFSR, wherein the LFSR generates the test pattern according to a characteristic polynomial; and
   c) applying the test pattern of the scan chain to inputs of the circuit block.

3. The method of claim 2, wherein step (a) further includes the step of first placing the integrated circuit in a test mode.

4. The method of claim 2, wherein step (c) further includes the step of first placing the integrated circuit in a system mode.

5. The method of claim 2, further comprising the steps of:
   d) subsequent to step (c), loading outputs from the circuit block in to the scan chain; and
   e) creating a signature value in the LFSR by applying the test clock N times such that the contents of the shift register are shifted through the LFSR and compressed according to a characteristic polynomial of the LFSR.

6. The method of claim 5, wherein step (e) further comprises the step of first placing the integrated circuit in a test mode.

7. The method of claim 5, wherein step (e) further comprises the step of simultaneously creating a second, non-successive, test pattern in the scan chain.

8. The method of claim 2, further comprising the steps of:
   d) subsequent to step (c), loading outputs from the circuit block in to the scan chain; and
   e) repeating steps (b) and (c) until a predetermined time at which the BIST sequence is to conclude.

9. The method of claim 2, wherein setting the contents of the scan chain to an initial value in step (a) further comprises serially scanning an initial test seed in to the LFSR.

10. The method of claim 2, wherein setting the contents of the scan chain to an initial value in step (a) further comprises resetting the contents of the scan chain to a zero value.

11. A scan chain for use in a built-in self test (BIST) sequence performed on a circuit block in an integrated circuit, the scan chain comprising:
   a) a linear feedback shift register (LFSR); and
   b) a shift register cascaded with the LFSR and coupled in a circular path wherein an output of a last storage element of the shift register is fed back to an input of a first storage element of the LFSR such that when a test clock is asserted, contents of the shift register are shifted through the LFSR such that a pseudo-random test pattern is generated in the scan chain.

12. The scan chain of claim 11 wherein the LFSR is a primitive polynomial LFSR.

13. The scan chain of claim 11 wherein the circular path further comprises an XOR gate coupled between the output of the last storage element of the shift register and the input of the first storage element of the LFSR.

14. The scan chain of claim 11 wherein the shift register further comprises a plurality of cascaded scan flip-flops.

15. A microprocessor capable of performing a built-in self test (BIST) comprising:
   a) a circuit block;
   b) a scan chain, including
      a linear feedback shift register (LFSR), and
      a shift register cascaded with the LFSR and coupled in a circular path wherein an output of a last storage element of the shift register is fed back to an input of a first storage element of the LFSR such that when a test clock is asserted, contents of the shift register are shifted through the LFSR such that a pseudo-random test pattern is generated in the scan chain.

16. The microprocessor of claim 15 wherein the LFSR is a primitive polynomial LFSR.

17. The microprocessor of claim 15 wherein the circular path further comprises an XOR gate coupled between the output of the last storage element of the shift register and the input of the first storage element of the LFSR.

18. The microprocessor of claim 15 wherein the shift register further comprises a plurality of cascaded scan flip-flops.

19. A scan chain for generating non-successive pseudo-random test patterns for testing a circuit block in an integrated circuit, the scan chain comprising:
   a) pattern generation means for generating a plurality of pseudo-random test patterns, each test pattern being successively ordered, wherein each test pattern is generated from a test seed in accordance with a characteristic polynomial;
   b) coupling means for applying the generated plurality of pseudo-random test patterns to inputs of the circuit block in the integrated circuit and receiving corresponding outputs from the circuit block; and
   c) reseeding means for automatically providing the pattern generation means with the outputs from the circuit block, wherein the outputs from the circuit block are used as a test seed for a subsequent pseudo-random test pattern generated by the pattern generation means such that the subsequent pseudo-random test pattern is non-successive.

* * * * *

UNITED STATES PATENT AND TRADEMARK OFFICE
CERTIFICATE OF CORRECTION

PATENT NO.    :   5,574,733
DATED         :   November 12, 1996
INVENTOR(S)   :   Kee S. Kim It is certified that error appears in the above-identified patent and that said Letters Patent is hereby corrected as shown below:

In column 4 at line 48 delete "10-18" and insert --I0-I8--

In column 4 at line 58 delete "10-18" and insert --I0-I8--

Column 8, line 61, delete "generated"

Signed and Sealed this

Twenty-second Day of April, 1997

Attest:

BRUCE LEHMAN

*Commissioner of Patents and Trademarks*

*Attesting Officer*